United States Patent [19]

Huemmer et al.

[11] Patent Number: 5,112,723

[45] Date of Patent: May 12, 1992

[54] PHOTOSENSITIVE RECORDING ELEMENT

[75] Inventors: Wolfgang Huemmer, Limburgerhof; Walter Dobler, Heidelberg; Dieter Littmann, Mannheim, all of Fed. Rep. of Germany

[73] Assignee: BASF Aktiengesellschaft, Ludwigshafen, Fed. Rep. of Germany

[21] Appl. No.: 476,939

[22] Filed: Feb. 8, 1990

[30] Foreign Application Priority Data

Feb. 24, 1989 [DE] Fed. Rep. of Germany ....... 3905765

[51] Int. Cl.$^5$ .................. G03C 1/73; G03F 7/038
[52] U.S. Cl. .................. 430/287; 430/281; 522/14; 522/16; 522/26
[58] Field of Search .................. 430/287, 281; 522/14, 522/16, 26

[56] References Cited

U.S. PATENT DOCUMENTS

| | | | |
|---|---|---|---|
| 3,097,096 | 7/1963 | Oster | 522/26 |
| 3,556,794 | 1/1971 | Margerum . | |
| 3,607,691 | 9/1971 | Goldberg et al. | 522/26 |
| 4,198,241 | 4/1980 | Bronstert et al. | 522/16 |
| 4,272,611 | 6/1981 | Vyvial et al. . | |
| 4,343,885 | 8/1982 | Reardon, Jr. | 430/281 |
| 4,496,646 | 1/1985 | Ito | 522/26 |
| 4,587,201 | 5/1986 | Morikawa et al. | 430/286 |
| 4,849,930 | 7/1989 | Hoffmann et al. | 430/287 |
| 4,925,769 | 5/1990 | Huemmer et al. | 430/271 |
| 4,957,852 | 9/1990 | Bronstert | 430/287 |

FOREIGN PATENT DOCUMENTS 60-165647 8/1985 Japan .

OTHER PUBLICATIONS

Chemical Abstracts CA107(26): 246717 g.
Chemical Abstracts CA88(8): 56975 f.
Chemical Abstracts CA108(4): 224546.
Chemical Astracts CA105(16):143569q.
Chemical Abstracts CA103(8): C2578y.

Primary Examiner—C. D. RoDee
Attorney, Agent, or Firm—Keil & Weinkauf

[57] ABSTRACT

In a photosensitive recording element which contains at least one photopolymerizable recording layer (B) consisting of $b_1$) at least one partially of virtually completely hydrolyzed poly(vinyl alkanecarboxylate) and/or at least one partially or virtually completely hydrolyzed vinyl alkanecarboxylate/alkylene oxide graft copolymer as a binder, $b_2$) at least one photopolymerization initiator, $b_3$) at least one photopolymerizable olefinically unsaturated compound (monomer) which is compatible with the binder ($b_1$), and/or photopolymerizable olefinically unsaturated radicals which are bonded as side radicals and/or terminal radicals to the binder ($b_1$), and $b_4$) at least two assistants, at least one of the said assistants ($b_4$) has been selected from the group consisting of $b_{41}$) the isoalloxazines and the alloxazines, and at least one of the other assistants has been selected from the group consisting of $b_{42}$) the potassium salt of N-nitrosocyclohexylhydroxlamine, N-nitrosodiphenylamine and hydroquinone monomethyl ether, the amounts used of the assistants ($b_{41}$) and ($b_{42}$) being from 0.01 to 6% by weight, based on the total weight of the photopolymerizable recording layer (B), and the weight ratio ($b_{41}$) : $B_{42}$) being from 1:2 to 1:1,000.

4 Claims, No Drawings

PHOTOSENSITIVE RECORDING ELEMENT

The present invention relates to a novel photosensitive recording element for the production of relief printing plates and photoresists having at least one photopolymerizable recording layer of partially or virtually completely hydrolyzed poly(vinyl alkanecarboxylates) and/or partially or virtually completely hydrolyzed vinyl alkanecarboxylate/alkylene oxide graft copolymers, photopolymerization initiators, photopolymerizable monomers and/or photopolymerizable olefinically unsaturated radicals, which are bonded as side radicals and/or terminal radicals to the abovementioned polymers, and at least two assistants.

Photosensitive recording elements of the type stated at the outset have long been known. For the production of relief printing plates or of photoresists, their photopolymerizable recording layer is exposed imagewise to actinic light, with the result that the exposed parts are photopolymerized and form crosslinked parts of the layer which remain insoluble in the developers. Thereafter, the unexposed parts of the imagewise exposed recording layer are washed out by means of a suitable developer with production of a photopolymerized relief layer.

However, relief layers produced from the known photosensitive recording elements and having a relief height of about 1 μm to 0.5 cm, which is conventional in the printing industry, generally do not have the desired crisp relief fine structure and frequently have side walls which slope too gently, this being due to comparatively high scattering of the actinic light in the photopolymerizable recording layer during imagewise exposure. Attempts have already been made to overcome or at least to reduce these disadvantages by adding certain assistants which improve the relief structure to the photopolymerizable recording layers of the known photosensitive recording elements. It is known that the said assistants are referred to as sensitometric regulators.

In this context, considerable progress has been made through the use of the combination, recommended in DE-A-32 48 247, of from 0.0001 to 1% by weight of a phenoxazinium, phenazinium, acridinium or phenothiazinium dye and from 0.005 to 5% by weight of a mild reducing agent which is capable of reducing the relevant dye only in the excited electronic state. Preferably used mild reducing agents here are ascorbic acid, anethole, thiourea, diethylallylthiourea, N-allylthiourea, salts of N-nitrosocyclohexylhydroxylamine or hydroquinone monomethyl ether. Very specifically, DE-A-32 48 247 discloses photopolymerizable recording layers of the type stated at the outset which contain the dye Safranine T (C.I. 50,240) in combination with N-nitrosocyclohexylhydroxylamine in a weight ratio of 1:25, in combination with hydroquinone monomethyl ether and ascorbic acid in a weight ratio of 1:25 or in combination with hydroquinone monomethyl ether in a weight ratio of 1:15.

Furthermore, US-A-4 272 611 (EP-A-0 010 690) discloses photopolymerizable recording layers of the type stated at the outset, which contain the dye eosin and N-nitrosocyclohexylhydroxylamine in a weight ratio of 1:10 or of 1:20.

Moreover, EP-A-0 224 164 discloses photopolymerizable recording layers of the type stated at the outset which contain the dye Duasyn Basic Red TM (C.I. 50,240) in combination with the potassium salt of N-nitrosocyclohexylhydroxylamine in a weight ratio of 1:13.3. In addition, German Patent Application P 38 08 952.1 describes a photopolymerizable recording layer of the type stated at the outset which contains the dyes Safranine T (C.I. 50,240) and crystal violet (C.I. 42,555) and N-nitrosocyclohexylhydroxylamine in a weight ratio of 1:5.

However, the dyes are also washed out during development of the known imagewise exposed photopolymerizable recording layers of the photosensitive recording elements and discolor the spent developers, making it more difficult to reuse them and/or dispose of them in an environmentally compatible way. Moreover, the requirements set by the printing industry and electrical industry with respect to the quality of the relief printing plates and photoresists produced using photopolymerizable recording layers have increased steadily over the past few years, making it essential to continue developing the methods for improving the relief structure.

It is also known that compounds from the class consisting of the isoalloxazines and of the alloxazines can be used in connection with image production by means of photosensitive recording elements. Here, however, the isoalloxazines or the alloxazines are used in combination with a mild reducing agent as photopolymerization initiators which are sensitive to visible light.

Photopolymerization initiators of this type are disclosed, for example, in U.S. Pat. No. 3 556 794. An example of a suitable isoalloxazine is riboflavin. Aromatic or aliphatic sulfinic acids and their inorganic salts and organic esters, sulfinyl halides, sulfinamides, adducts of sulfinic acids and carbonyl compounds and triallyland trialkyl-substituted phosphines and arsines are used as mild reducing agents. In the presence of a non-aromatic carboxylic acid or its salt, these photopolymerization initiators sensitive to visible light are deactivated by exposure to UV light, as is evident in particular from Example 8, column 26, line 14, to column 27, line 41, in conjunction with Table 7, columns 27 and 28, of U.S. Pat. No. 3 556 794.

Furthermore, Japanese Preliminary Published Application JP-A-52/96 102 discloses a photopolymerizable mixture which is used for the production of printing plates. This photopolymerizable mixture contains a polymer having carboxyl groups (Gantrez® AN-119 from GAF Corp., copolymer of methyl vinyl ether and maleic anhydride), a water soluble polymer, such as poly(ethylene oxide), photopolymerizable monomers, e.g. methylenebisacrylamide and N-methylolacrylamide and assistants, such as p-methoxyphenol. This photopolymerizable mixture contains, as a photopolymerization initiator, a combination of the sodium salt of riboflavin 5'-phosphate (flavin mononucleotide, FMN) with allylthiourea.

In the photopolymerizable mixture which is disclosed in the international Patent Application WO 83/3687 and which contains polymethyl methacrylate as a binder, a mixture of 1,3-dipentylalloxazine and triethylamine is used as the photopolymerization initiator.

Japanese Preliminary Published Application JP-A-60/165 647 discloses a photopolymerizable mixture which contains a binder, such as a butyl methacrylate/2-ethylhexyl methacrylate/methyl methacrylate/methacrylic acid copolymer, a photopolymerizable monomer, such as tetraethylene glycol diacrylate, and assistants, such as hydroquinone, and dyes, e.g. Victoria Sky Blue. The photopolymerization initiator used is a combination of an aromatic amino compound, such as 4-dimethylaminobenzoin, and an isoalloxazine, such as riboflavin tetrabutyrate (RFTB).

A comparable photopolymerizable mixture which is very particularly sensitive to visible light is disclosed in Japanese Preliminary Published Application JP-A-60/57 832. In this Application, aminobenzoic acid derivatives, such as iosamyl p-dimethylaminobenzoate, are used instead of the abovementioned aromatic amino compounds.

Moreover, the photopolymerizable mixture disclosed in Japanese Preliminary Published Application JP-A-61/725 138 is very similar to that disclosed in the abovementioned Japanese Preliminary Published Application JP-A-60/165 647 and is likewise very particularly sensitive to visible light.

A combination of an isoalloxazine derivative, such as riboflavin tetrabutyrate (RFTB), and a further coinitiator is also used as a photopolymerization initiator for visible light in the photopolymerizable mixture of Japanese Preliminary Published Application JP-A-62/156 103, which mixture contains an ethyl acrylate/methacrylic acid/methyl methacrylate copolymer as a binder, pentaerythritol triacrylate as a photopolymerizable monomer and hydroquinone monomethyl ether and Victoria Sky Blue as assistants. In contrast to the patents described above, an organic peroxide is used as a coinitiator here.

Furthermore, Japanese Preliminary Published Application JP-A-62/123 450 discloses a photopolymerizable mixture which is comparable with that described above but in which an N-arylaminoacid, such as N-phenylglycine, is used as the coinitiator.

The common feature of all these known photopolymerization initiators containing isoalloxazine derivatives or alloxazine derivatives is that they are extremely sensitive to visible light.

The prior art does not indicate that it might be possible to use compounds from the classes consisting of the isoalloxazines and of the alloxazines together with specially selected mild reducing agents in photopolymerizable recording layers which contain partially or virtually completely hydrolyzed poly(vinyl alkanecarboxylates) and/or partially or virtually completely hydrolyzed vinyl alkanecarboxylate/alkylene oxide graft copolymers as binders, in order to improve the relief structure, i.e. as a combination of assistants or as a sensitometric regulator. On the contrary, their excellent action as photopolymerization initiators during exposure to visible light indicates that their use in the said photopolymerizable recording layers does not have any useful technical effect but in practice tends to have disadvantages, particularly in handling.

It is an object of the present invention to provide a novel photosensitive recording element having at least one photopolymerizable recording layer of at least one partially or virtually completely hydrolyzed poly(vinyl alkanecarboxylate) and/or at least one partially or virtually completely hydrolyzed vinyl alkanecarboxylate/alkylene oxide graft copolymer as a binder, at least one photopolymerizable olefinically unsaturated compound (monomer) which is compatible with the binder, and/or photopolymerizable olefinically unsaturated radicals which are bonded as side radicals and/or terminal radicals to the binders, and at least two assistants, which recording element makes it possible for relief printing plates and photoresists having a crisp relief structure to be produced faithfully to the original even in the case of very fine image elements.

Furthermore, the novel photosensitive recording element should no longer have the disadvantages of the prior art and, after it has been exposed imagewise to short-wavelength actinic light and developed with a suitable developer, it should in particular lead to relief printing plates and photoresists having an improved relief structure.

We have found that this object is achieved, surprisingly, by a photosensitive recording element having at least one photopolymerizable recording layer of the type under discussion, which contains, in its photopolymerizable recording layer, at least one combination of at least two assistants of the type described below, as a sensitometric regulator.

The present invention accordingly relates to a novel photosensitive recording element for the production of relief printing plates or photoresists, comprising A) a dimensionally stable substrate and
B) at least one photopolymerizable recording layer of
  $b_1$) at least one partially or virtually completely hydrolyzed poly(vinyl alkanecarboxylate) and/or at least one partially or virtually completely hydrolyzed vinyl alkanecarboxylate/alkylene oxide graft copolymer as a binder,
  $b_2$) at least one photopolymerization initiator which, on exposure to short-wavelength actinic light, provides radicals which initiate the photopolymerization,
  $b_3$) at least one photopolymerizable olefinically unsaturated compound (monomer) which is compatible with the binder ($b_1$), and/or photopolymerizable olefinically unsaturated radicals which are bonded as side radicals and/or terminal radicals to the binder ($b_1$), and
  $b_4$) at least two assistants,
wherein the photopolymerizable recording layer (B) of the said recording element contains, as assistants $b_4$), at least the sensitometric regulator ($b_4$) consisting of
$b_{41}$) one or more compounds from the group consisting of the isoalloxazines and/or from the group consisting of the alloxazines and
$b_{42}$) the potassium salt of N-nitrosocyclohexylhydroxylamine, N-nitrosodiphenylamine and/or hydroquinone monomethyl ether
in an amount of from 0.01 to 6% by weight, based on the photopolymerizable recording layer (B), the weight ratio ($b_{41}$):($b_{42}$) being from 1:2 to 1:1,000.

For the purposes of the present invention, the term compatible generally indicates that the relevant component can be distributed in the photopolymerizable recording layer (B) in molecular disperse form and/or without causing turbidity or streaks and furthermore does not separate out from this layer in the course of time.

Assistants are understood here as meaning compounds which very generally are used to achieve a variation, usually an improvement, in the performance characteristics of photosensitive recording layers, in particular photopolymerizable recording layers (B). These improvements manifest themselves in particular in relief printing plates and photoresists which have been produced using the photosensitive recording layers which contain these assistants.

The novel photosensitive recording element, according to the invention, for the production of relief printing plates or photoresists, which has at least one photopolymerizable recording layer (B), is referred to below as novel recording element for the sake of brevity.

The essential feature of the novel recording element is its novel photopolymerizable recording layer (B).

That component of the novel photopolymerizable recording layer (B) which is essential according to the invention is the sensitometric regulator (b₄).

The sensitometric regulator (b₄) to be used according to the invention consists of at least one of the assistants (b₄₁) and of at least one of the assistants (b₄₂).

The assistants (b₄₁) to be used according to the invention are compounds from the group consisting of the isoalloxazines or from the group consisting of the alloxazines. In this case, the sensitometric regulator (b₄) contains either at least one compound from the group consisting of the isoalloxazines or at least one compound from the group consisting of the alloxazines. The said regulator (b₄) can of course also contain at least one compound from the group consisting of the isoalloxazines and at least one compound from the group consisting of the alloxazines.

Examples of compounds which are suitable according to the invention from the groups consisting of the alloxazines and of the isoalloxazines are alloxazine, isoalloxazines and alloxazines which are mono-, di-, tri-, tetra-, penta- or hexasubstituted by alkyl radicals in the 3-, 5-, 6-, 7-, 8- and/or 9-position and in which alkyl is methyl, ethyl, n-propyl, isopropyl, n-butyl, n-pentyl, n-hexyl, n-heptyl, n-octyl, n-nonyl, n-decyl, n-undecyl, n-dodecyl, n-tridecyl, n-tetradecyl, n-heptadecyl, n-hexadecyl, n-heptadecyl, n-octadecyl, n-nonadecyl or n-eicosanyl, and 6,7-dimethyl-9-(D-1'-ribityl)flavin (riboflavin, RF), riboflavin 5'-phosphate (flavin mononucleotide, FMN), riboflavin tetraesters, such as the tetraacetate, tetrapropionate, tetrabutyrate and tetravalerate, of which alloxazine, 7,8-dimethylalloxazine, 7,8,9-trimethylisoalloxazine, riboflavin (RF), riboflavin tetrabutyrate (RFTB), the flavin mononucleotide (FMN) and its sodium salt are particularly suitable.

The sensitometric regulator (b₄) to be used according to the invention contains at least one assistant (b₄₂). These are the specially selected mild reducing agents, i.e. the potassium salt of N-nitrosocyclohexylhydroxylamine, N-nitrosodiphenylamine and hydroquinone monomethyl ether. Of these three compounds, at least one is present in the sensitometric regulator (b₄).

In the sensitometric regulator (b₄) to be used according to the invention, the weight ratio of the assistants (b₄₁):(b₄₂) is from 1:2 to 1:1,000. It is generally not advisable to increase the amount of assistants (b₄₁) to such an extent that weight ratios (b₄₁):(b₄₂) greater than 1:2 result, since otherwise the technical effects produced by the sensitometric regulator do not always fully meet the practical requirements. The same applies if the weight ratio (b₄₁):(b₄₂) is chosen to be smaller than 1:1,000.

Accordingly, the range of from 1:2 to 1:1,000 for the weight ratios (b₄₁):(b₄₂) is an optimum within which the weight ratio of the assistants (b₄₁) and (b₄₂) can be advantageously varied and adapted to the particular photopolymerizable recording layer (B) used. Within this optimum range, the weight ratios (b₄₁):(b₄₂) of from 1:10 to 1:100, in particular from 1:10 to 1:50, are noteworthy because such weight ratios result in a very particularly advantageous performance characteristics of the relevant novel photopolymerizable recording layer (B). This means that sensitometric regulators (b₄) whose assistants (b₄₁) and (b₄₂) have such a weight ratio give rise to particularly advantageous technical effects and are therefore very particularly preferred according to the invention.

Regardless of the weight ratio of the assistants (b₄₁) and (b₄₂) to one another in the sensitometric regulator (b₄) to be used according to the invention, the said regulator (b₄) is always present in an amount of from 0.01 to 6% by weight in the novel photopolymerizable recording layer (B). It is not generally advisable here to increase the amount of the sensitometric regulator (b₄) in the novel photopolymerizable recording layer (B) to more than 6% by weight because, under certain circumstances, undesirable secondary reactions may occur in the said recording layer (B) during its storage and handling and/or during or after its imagewise exposure. On the other hand, the amount of the sensitometric regulator (b₄) in the said recording layer (B) should not fall below 0.01% by weight in general since, below this level, the technical effects due to the sensitometric regulator (b₄) do not always fully meet the practical requirements.

Accordingly, the range from 0.01 to 6% by weight is an optimum within which the amount of the sensitometric regulator (b₄) in the novel photopolymerizable recording layer (B) can be advantageously varied and adapted to the particular novel photopolymerizable recording layer (B) used. Within this optimum range, that from 0.03 to 4% by weight is preferred because novel photopolymerizable recording layers (B) having such a content of sensitometric regulator (b₄) are particularly advantageous and give relief layers (B') having an excellent relief structure.

Within this range preferred according to the invention, that from 0.1 to 1% by weight is in turn noteworthy, because such an amount of sensitometric regulator (b₄) gives rise to very particularly advantageous performance characteristics of the relevant novel photopolymerizable recording layer (B). This means that this amount of sensitometric regulator (b₄) is very well balanced with regard to the amount of material used on the one hand and the technical effect achieved on the other hand, and is therefore very particularly preferred according to the invention.

The novel photopolymerizable recording layer (B) contains from 10 to 99, preferably from 20 to 80, in particular from 30 to 70, % by weight, based on its total amount, of at least one partially or virtually completely hydrolyzed poly(vinyl alkanecarboxylate) and/or at least one partially or virtually completely hydrolyzed vinyl alkanecarboxylate/alkylene oxide graft copolymer as a binder (b₁). Accordingly, the said recording layer (B) may contain either one of the binders (b₁), several binders (b₁) or all binders (b₁) of the abovementioned type.

Examples of suitable binders (b₁) here are the known water-soluble or water-dispersible hydrolyzed poly(vinyl alkanecarboxylates) which contain repeating 1-hydroxy-1,2-ethylidene units

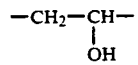

in the polymer chain, have number average molecular weights $\overline{M}_n$ of $10^4$ to $10^5$, in particular from $1.5 \times 10^4$ to $5 \times 10^4$ and possess a degree of hydrolysis of from 60 to 99.9, preferably from 70 to 99, in particular from 75 to 95%. Among these, partially or virtually completely hydrolyzed polyvinyl acetate or propionate is particularly suitable. They are generally also referred to as polyvinyl alcohols.

Other examples of suitable binders (b₁) are partially or virtually completely hydrolyzed vinyl alkanecarboxylate/alkylene oxide graft copolymers which are obtained by grafting vinyl acetate or vinyl propionate onto polyethylene oxide and then hydrolyzing the product and which consist of from 10 to 30% by weight of 1-oxa-1,3-propylidene units

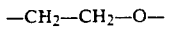

from 0.01 to 30% by weight of 1-acetyl- or 1-propionyl-1,2-ethylidene units

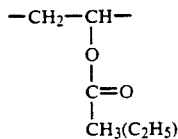

and from 89.99 to 40% by weight of 1-hydroxy-1,2-ethylidene units, the percentages in each case being based on the graft copolymer. Graft copolymers of this type are disclosed in, for example, EP-A-0 010 690 or EP-A-0 224 164.

Both the abovementioned polyvinyl alcohols and the hydrolyzed vinyl alkanecarboxylate/alkylene oxide graft copolymers may contain polymerizable olefinically unsaturated radicals (b₃) which are bonded as side radicals and/or terminal radicals to the relevant polymer chains. These photopolymerizable olefinically unsaturated radicals (b₃) are side alkenecarboxylic radicals, such as acrylic, methacrylic or maleic acid radicals, or alkenecarbonylamino-N-methylene ether radicals, such as acrylamido- or methacrylamido-N-methylene ether radicals. The said radicals (b₃) can be prepared by the conventional, known polymer-analogous reactions of the relevant anhydrides or of the relevant methylolated alkenecarboxamides with the polyvinyl alcohols or the hydrolyzed vinyl alkanecarboxylate/alkylene oxide graft copolymers. Usually, from 0.1 to 10, preferably from 0.5 to 8, in particular from 1 to 6, mol % of the hydroxyl groups present in the relevant polymers are converted here.

The photopolymerizable olefinically unsaturated radicals (b₃) bonded to the binders (b₁) in the manner described above may be the sole photopolymerizable components of the novel photopolymerizable recording layer (B). The said recording layer (B) can, however, also contain at least one photopolymerizable olefinically unsaturated compound (monomer) (b₃). It is advantageous here if the said recording layer (B) contains at least one such monomer (b₃). In this case, the concomitant use of the photopolymerizable olefinically unsaturated radicals (b₃) may be dispensed with.

Suitable monomers (b₃) are compatible with the binder (b₁). In general, they have a boiling point of more than 100° C. Usually, they have a molecular weight of less than 3,000, preferably of less than 2,000.

Examples of suitable monomers (b₃) are the esters of acrylic acid and/or methacrylic acid with monohydric or polyhydric alcohols, for example butyl acrylate, butyl methacrylate, 2-ethylhexyl acrylate, lauryl acrylate, lauryl methacrylate, ethylene glycol di(meth)acrylate, butane-1,5-diol di(meth)acrylate, neopentylglycol di(meth)acrylate, 3-methylpentanediol di(meth)acrylate, 2-hydroxypropyl (meth)acrylate, 2-hydroxyethyl (meth)acrylate, hexane-1,6-diol di(meth)acrylate, 1,1,1-trimethylolpropane tri(meth)acrylate, di-, tri- and tetra-ethylene glycol di(meth)acrylate, 3,12-dihydroxy-1,5,10,14-tetraoxatetradec-1,14-diyldi(meth)acrylate, 2-hydroxy-3-phenoxypropyl (meth)acrylate and ethylene glycol, diethylene glycol, triethylene glycol, tetraethylene glycol, propylene glycol, dipropylene glycol, butane-1,4-diol, pentane-1,5-diol and hexane-1,6-diol diglycidyl ether di(meth)acrylate. Other examples of suitable monomers (b₃) are vinyl esters of aliphatic monocarboxylic acids, such as vinyl oleate; divinyl ethers of alcohols, such as octadecyl vinyl ether and butane-1,4-diol divinyl ether; the diesters of fumaric and maleic acid; or the reaction products of OH-terminated oligobutadienes of maleic acid and/or with acrylic acid; the alkenecarbonylamino-N-methylene ethers, such as ethylene glycol-bis-, propanediol-bis-, butanediol-bis-, diethylene glycol-bis-, glycerol-bis-, glycerol-tris- or pentaerythritol-tetrakis-(methacrylamido-N-methylene ether), and the corresponding acrylamido-N-methylene ethers.

If the monomers (b₃) are used, they are present in the novel photopolymerizable recording layer (B) in an amount of from 10 to 70, preferably from 20 to 60, in particular from 25 to 55%, by weight.

Another important component of the novel photopolymerizable recording layer (B) is at least one photopolymerization initiator (b₂). During exposure to short-wavelength actinic light, i.e. UV light, it provides radicals which initiate and maintain the free radical polymerization of the monomers (b₃) and/or of the olefinically unsaturated radicals (b₃), the process also being referred to as photopolymerization. In the novel photopolymerizable recording layer (B), the photopolymerization initiators (b₂) are present in an amount of from 0.01 to 10, preferably from 0.1 to 8, in particular from 0.5 to 5%, by weight.

Examples of suitable photopolymerization initiators (b₂) are benzoin and benzoin derivatives, such as its methyl, isopropyl, n-butyl or isobutyl ether; symmetrically or asymmetrically substituted benzil acetals, such as benzil dimethyl acetal or benzil 1-methyl 1-ethyl acetal; acyldiarylphosphine oxides and acylarylphosphinic acid derivatives, such as 2,6-dimethoxybenzoyl-diphenylphosphine oxide, 2,4,6-trimethylbenzoyldiphenylphosphine oxide, sodium 2,4,6-trimethylbenzoyl-phenylphosphinate or ethyl 2,4,6-trimethylbenzoyl-phenylphosphinate; and substituted or unsubstituted quinones, such as ethylanthraquinone, benzanthraquinone, benzophenone or 4,4'-bis-(dimethylamino)-benzophenone. They can be used alone or as a mixture with one another.

Furthermore, the novel photopolymerizable recording layer (B) may contain other conventional and known additives (b₄), such as thermal polymerization inhibitors, plasticizers, antistatic agents, dyes, pigments, photochromic additives, reducing agents, agents for improving the relief structure, antioxidants, fillers, reinforcing fillers, flow improvers, mold release agents, crosslinking agents, tackifiers and rubbers. These additives (b₄) may be present alone or as a mixture, in amounts of not more than 50% by weight, in addition to the obligatory sensitometric regulator (b₄), in the novel photopolymerizable recording layer (B).

The novel recording element contains at least one of the novel photopolymerizable recording layers (B) described above in detail. However, the novel recording element may contain two or more of these novel photopolymerizable recording layers (B) one on top of the other and firmly bonded to one another, and the novel recording layers (B) used may have identical or different compositions. In addition, the novel recording element may contain at least one known photopolymerizable recording layer. According to the invention, it is advantageous if the novel recording element contains only one novel photopolymerizable recording layer (B).

The other essential component of the novel recording element is the dimensionally stable substrate (A). Examples of suitable dimensionally stable substrates (A) are sheets, films or conical or cylindrical sleeves of metals such as steel, aluminum, copper or nickel or of high polymers such as polyethylene terephthalate, polybutylene terephthalate, polyamide or polycarbonate. Woven fabrics and nonwoven fabrics, such as glass fiber fabrics, or composite materials of, for example, glass fibers and high polymers, such as polyethylene terephthalate, are also suitable.

In addition to these two essential components, the dimensionally stable substrate (A) and the novel photopolymerizable recording layer (B), the novel recording element may contain further layers which are useful for its function. These further layers may be, for example, an adhesion-promoting layer which firmly bonds the dimensionally stable substrate (A) to the novel photopolymerizable recording layer (B). Examples of particularly suitable adhesion-promoting layers are described in German Patent Application P 37 19 844.0. Furthermore, the free side of the novel photopolymerizable recording layer (B) of the novel recording element can be covered with a top layer (C) and/or with a cover sheet (D).

Examples of suitable top layers (C) are from 0.5 to 20 μm thick and consist of a polymer which forms soluble, nontacky, transparent and strong films, for example polyamide, copolyamide, polyurethane, polyvinyl alcohol, polyvinylpyrrolidone, polyethylene oxide or cyclized rubber having a high degree of cyclization. The top layer (C) may be matt.

Examples of known cover sheets (D) are from 20 to 150 μm thick and consist of a polymer, such as polyamide or polyethylene terephthalate. On that side which faces the top layer (C) or the novel photopolymerizable recording layer (B), they may have conventional and known, 0.1–0.5 μm thick antiadhesion layers of, for example, silicone resins. The cover sheet (D) may be matt.

When the top layer (C) and the cover sheet (D) are used together, the top layer (C) is present directly on the novel photopolymerizable recording layer (B). Here, the composition of (C) and (D) is chosen in a conventional and known manner so that the top layer (C) adheres more firmly to the novel photopolymerizable recording layer (B) than to the cover sheet (D), so that the latter can be removed from the novel recording element in a simple manner without damaging the said element.

If the novel recording element contains a highly reflective sheet or film as a dimensionally stable substrate (A), the said sheet or film may contain conventional and known antihalation agents, such as carbon black or manganese dioxide. However, the antihalation agents may also be present as a separate layer on the dimensionally stable substrate (A) or may be present in the adhesion-promoting layer or in the novel photopolymerizable recording layer (B) itself.

The production of the novel recording element requires no special methods but is carried out by the production of photosensitive recording elements. Usually, the production of the novel recording element starts from the production of the novel photopolymerizable recording layer (B). For this purpose, its components $(b_1)$, $(b_2)$, $(b_3)$ and $(b_4)$ are mixed with one another by conventional kneading, mixing and dissolution techniques, so that a novel photopolymerizable mixture (B) results. This is then formed into the novel photopolymerizable recording layer (B) of the desired thickness in a conventional manner by casting from a solution, hot pressing, calendering or extrusion. The thickness depends primarily on the intended use of the novel photosensitive recording element. If it is used for the production of relief printing plates or photoresists, as is very particularly advantageous according to the invention, the thickness of its novel photopolymerizable recording layer (B) is preferably from 1 μm to 0.5 cm. The said recording layer (B) may be applied directly to the surface of the dimensionally stable substrate (A) or to the surface of the adhesion-promoting layer present on the substrate (A), after which the free side of the said recording layer is bonded to the top layer (C) and/or to the cover sheet (D). However, it is also possible first to apply the novel photopolymerizable recording layer (B) to the surface of the cover sheet (D), which surface is covered by the top layer (C), and then firmly to bond the free surface of the photopolymerizable recording layer (B) to the dimensionally stable substrate (A), if necessary via an adhesion-promoting layer.

The novel recording element can be converted in a conventional and known manner into photopolymerized relief printing plates and photoresists which contain a novel relief layer (B'). Their production involves no special methods but is carried out, if necessary after a pretreatment, by imagewise exposure of the novel recording element to short-wavelength actinic light having a wavelength λ of from 300 to 450 nm, advantageously from 320 to 400 nm, through a photographic negative placed on top, followed by washing out of the unexposed and therefore nonphotopolymerized parts of the imagewise exposed recording layer (B) with a suitable developer, so that the novel relief layer (B') results. This is usually dried after its production.

Examples of conventional pretreatments comprise peeling off any cover sheet (D) which may be present in the novel recording element and uniformly exposing the novel photopolymerizable recording layer (B) and/or any adhesion-promoting layer present to actinic light from the back and/or from the front.

Suitable sources of actinic light are, for example, commercial UV fluorescence tubes, medium pressure, high pressure and low pressure mercury lamps, superactinic fluorescent tubes, pulsed xenon lamps, lamps doped with metal iodides or carbon arc lamps.

Examples of suitable developers are water, aqueous alcoholic solutions or aqueous alkaline solutions, which may contain suitable additives, for example surfactants.

After drying, the novel relief layer (B') can be subjected to conventional aftertreatment, for example uniform postexposure to actinic light.

The thickness of the novel relief layer (B') advantageously varies from 1 μm to 0.5 cm, depending on the intended use.

The relief printing plates obtained in this manner can be mounted in a conventional manner on printing cylinders and used for continuous printing. The photoresists obtained in this manner can be used for the production of electrical circuits in printed circuit boards.

In the above production of relief printing plates and photoresists, the novel recording element proves to be particularly rapidly exposable, its exposure latitude being extremely large, true to detail in the reproduction of even very fine critical image elements of the photographic negative, the resulting relief printing plate or the resulting photoresist moreover having an excellent relief fine structure which manifests itself in particular in the shadow well depths, and extremely stable to washing out, so that the development conditions can safely be made more severe in order to reduce the development times.

This results in a reduction in the cycle times in the production of relief printing plates and photoresists, which is a considerable advantage in practice. This advantage is particularly important in the production of relief printing plates.

These are not the only particular advantages of the novel recording element, and further advantages manifest themselves in a particularly convincing manner in the relief printing plates and the photoresists and in their use: for example, the relief printing plates produced from the novel recording elements give excellent prints in particularly long print runs, and the use of the photoresists leads to a reduction in the rejection rate in the production of electrical printed circuit boards.

EXAMPLES

In the Examples and Comparative Experiments below, a conventional and known standard negative was used for exposure of the novel and conventional recording elements. The shadow well depths in the relief printing plates produced from the novel and the conventional recording elements were measured visually in a conventional and known manner with the aid of a microscope. In Examples 1 to 8 and in Comparative Experiments V1 and V2, the shadow well depths for a screen of 50% tonal value with a resolution of 60 lines/cm [$=t_r(50)$] and the shadow well depth in a negative point of 0.4 mm diameter ($=t_{NP}$) were measured in $\mu$m. Furthermore, the overall quality of the relief layers (B') of the relief printing plates was assessed. The essential criteria for this were
crisp, steep relief sidewalls which were free of under-washing,
straight relief edges which were free of edge fragmentation and
very clearly defined shadow well depths.

After the visual assessment of the relief layers (B') of the printing plates, the latter were clamped on printing cylinders and used for continuous letterpress printing. The known letterpress printing presses conventionally used for letterpress printing and the corresponding typical, conventional and known letterpress printing inks were used for this purpose. The decisive quality criterion for the particular printing plate used was the number of excellent prints achievable in a print run with this printing plate.

EXAMPLES 1 TO 7 AND COMPARATIVE EXPERIMENT V1

Production of novel (Examples 1 to 7) and conventional (Comparative Experiment V1) recording elements and their use for the production of printing plates; general method of production:

50% strength solutions of the particular components ($b_1$), ($b_2$), ($b_3$) and ($b_4$) of the relevant photopolymerizable recording elements were prepared in a mixture of water and methanol in a weight ratio of 40:60 at 60° C.

The particular solutions were poured onto polyethylene terephthalate cover sheets (D) so that, after evaporation of the solvent at room temperature, 0.5 mm thick photopolymerizable recording layers resulted. The photopolymerizable recording layers thus obtained were firmly bonded to 0.2 mm thick polyethylene terephthalate films (A) using a mixture of ethanol and water in a volume ratio of 1:1, via the adhesion-promoting layers described in German Patent Application P 38 08 952.1.

Thereafter, the polyethylene terephthalate cover sheets (D) were removed. The photopolymerizable recording layers were then covered with standard negatives and exposed imagewise to actinic light for 3 minutes in a commercial exposure unit containing fluorescent tubes (emission maximum at $\lambda=350$ nm), then developed in a commercial spray washer at 40° C. and under a water pressure of 4 bar for 3 minutes and then dried.

The relief layers (B') of the relief printing plates obtained in this manner were assessed visually, after which the said plates were clamped on printing cylinders and used for continuous letterpress printing.

Table 1 provides information about the composition of the photopolymerizable recording layers produced and further processed in the abovementioned manner. The results of the visual assessment of the relief layers (B') are summarized in Table 2.

In Table 1, the abbreviations have the following meanings:
($b_{11}$) Vinyl alcohol/ethylene oxide graft copolymer having an ethylene oxide content of 40% by weight and a weight average molecular weight $\overline{M}_w$ of $3.5 \times 10^4$ according to EP-A-0 224 164;
($b_{21}$) Benzil dimethyl acetal;
($b_{31}$) 2-Hydroxy-3-phenoxypropyl acrylate;
RF Riboflavin;
RFTB Riboflavin tetrabutyrate and
FMN Flavin mononucleotide.

TABLE 1

Composition of the novel photopolymerizable recording layers (B) (Examples 1 to 7) and of the conventional recording layer (Comparative Experiment V1)

| | | | | Components | | |
|---|---|---|---|---|---|---|
| | | | | Sensitometric regulator $b_4$: | | |
| Example No. | $b_1$ (% by wt.) | $b_2$ (% by wt.) | $b_3$ (% by wt.) | $b_{41}$ (% by wt.) | $b_{42}$ (% by wt.) | Weight ratio $b_{41}:b_{42}$ |
| 1 | $b_{11}$ (53.911) | $b_{21}$ (1.47) | $b_{31}$ (44.1) | RFTB (0.029) | Potassium salt of N-nitrosocyclo-hexylhydroxylamine (0.49) | 1:16 |
| 2 | $b_{11}$ (53.911) | $b_{21}$ (1.47) | $b_{31}$ (44.1) | RFTB (0.029) | Hydroquinone monomethyl ether (0.49) | 1:16 |
| 3 | $b_{11}$ | $b_{21}$ | $b_{31}$ | Sodium salt | Potassium salt of | 1:16 |

TABLE 1-continued

Composition of the novel photopolymerizable recording layers (B) (Examples 1 to 7) and of the conventional recording layer (Comparative Experiment V1)

| Example No. | $b_1$ (% by wt.) | $b_2$ (% by wt.) | $b_3$ (% by wt.) | Sensitometric regulator $b_4$: $b_{41}$ (% by wt.) | $b_{42}$ (% by wt.) | Weight ratio $b_{41}:b_{42}$ |
|---|---|---|---|---|---|---|
| | (53.911) | (1.47) | (44.1) | of FMN (0.029) | N-nitrosocyclo-hexylhydroxylamine (0.49) | |
| 4 | $b_{11}$ (53.9251) | $b_{21}$ (1.47) | $b_{31}$ (44.11) | RF (0.0049) | Potassium salt of N-nitrosocyclo-hexylhydroxylamine (0.49) | 1:100 |
| 5 | $b_{11}$ (53.9124) | $b_{21}$ (1.47) | $b_{31}$ (44.108) | Alloxazine (0.0196) | Potassium salt of N-nitrosocyclo-hexylhydroxylamine (0.49) | 1:25 |
| 6 | $b_{11}$ (53.9124) | $b_{21}$ (1.47) | $b_{31}$ (44.108) | 7,8-dimethyl-alloxazine (0.0196) | Potassium salt of N-nitrosocyclo-hexylhydroxylamine (0.49) | 1:25 |
| 7 | $b_{11}$ (53.9124) | $b_{21}$ (1.47) | $b_{31}$ (44.108) | 7,8,9-trimethyl isoalloxazine (0.0196) | Potassium salt of N-nitrosocyclo-hexylhydroxylamine (0.49) | 1:25 |
| V1 | $b_{11}$ (53.923) | $b_{21}$ (1.47) | $b_{31}$ (44.117) | — | Potassium salt of N-nitrosocyclo-hexylhydroxylamine (0.49) | — |

TABLE 2

| Example No. | Exposure time (min) | Shadow well depths $t_2$ (50) (μm) | $t_{NP}$ (μm) | Relief sidewalls | Relief edges |
|---|---|---|---|---|---|
| 1 | 3 | 42 | 170 | Steep, smooth | Straight |
| | 6 | 41 | 180 | Steep, smooth | Straight |
| 2 | 3 | 36 | 92 | Steep, smooth | Straight |
| | 6 | 32 | 70 | Steep, smooth | Straight |
| 3 | 3 | 43 | 175 | Steep, smooth | Straight |
| | 6 | 35 | 184 | Steep, smooth | Straight |
| 4 | 3 | 21 | 70 | Steep, smooth | Straight |
| | 6 | 20 | 80 | Steep, smooth | Straight |
| 5 | 3 | 30 | 147 | Steep, smooth | Straight |
| | 6 | 27 | 130 | Steep, smooth | Straight |
| 6 | 3 | 30 | 129 | Steep, smooth | Straight |
| | 6 | 28 | 132 | Steep, smooth | Straight |
| 7 | 3 | 48 | 195 | Steep, smooth | Straight |
| | 6 | 45 | 226 | Steep, smooth | Straight |
| Comparative Experiment V1 | 3 | 21 | 41 | Gentle slope | With fragmentation |
| | 6 | 22 | 28 | Gentle slope | With fragmentation |

The results of the experiments summarized in Table 2 demonstrate that the sensitometric regulator ($b_4$) to be used according to the invention results in a substantial improvement in the relief fine structure in the relief printing plates which were produced from the novel photopolymerizable recording layers (B) (Examples 1 to 7). Moreover, a very long print run of excellent copies was achieved during continuous printing without it being necessary to interrupt the printing process in order to clean the printing plates.

EXAMPLE 8 AND COMPARATIVE EXPERIMENT V2

Production and further processing of a novel recording element (Example 8) and of a conventional recording element (comparative Experiment V2); experimental method:

The novel recording element of Example 8 and the conventional recording element of Comparative Experiment V2 were produced by the general experimental method stated in Examples 1 to 7, using solvent mixtures at 80° C., consisting of water and n-propanol in a weight ratio of 3:1.

The photopolymerizable recording layer of the two recording elements was 0.5 mm thick.

The novel photopolymerizable recording layer (B) of Example 8 consisted of

26% by weight of the commercial vinyl alcohol/ethylene oxide graft copolymer Mowiol® 04-M1 from Hoechst AG, 41.808% by weight of a partially hydrolyzed polyvinyl acetate having a degree of hydrolysis of 80% and a degree of polymerization of 400 and in which 4 mol % of the free hydroxyl groups had been esterified with methacrylic acid, 30.462% by weight of butane-1,4-diol diglycidyl ether diacrylate, 1.2% by weight of benzil dimethyl acetal, 0.5% by weight of the potassium salt of N-nitrosocyclohexylhydroxylamine ($b_{42}$) and 0.03% by weight of riboflavin tetrabutyrate ($b_{41}$).

The photopolymerizable recording layer of the conventional recording element of Comparative Experiment V2 consisted of 26.08% by weight of the graft copolymer of Example 8,
41.734% by weight of the polyvinyl alcohol of Example 8,
30.486% by weight of the monomer of Example 8,
1.2% by weight of the photopolymerization initiator of Example 8 and
0.5% by weight of the potassium salt of N-nitrosocyclohexylhydroxylamine ($b_{42}$).

Relief printing plates were produced from these two recording elements by the experimental methods stated in Examples 1 to 7. The exposure time was in general 6 minutes here.

The novel recording element of Example 8 gave a relief layer (B') having a very well formed relief structure. The shadow well depth $t_z$ was 55 μm, the shadow well depth $t_{NP}$ was 235 μm. The relief sidewalls were steep and smooth and the relief edges were straight and showed no fragmentation. During printing on a letterpress printing unit, the relief printing plate gave excellent copies in a long print run of 200,000.

In contrast, the relief structure of the relief layer produced from the known recording element was less well defined. For example, the shadow well depths $t_z$ were 24 μm and shadow well depths $t_{NP}$ were 34 μm. In addition, the relief sidewalls were less steep and in some cases slightly underwashed. The relief edges exhibited isolated fragmentation.

These experimental results once again underline the advantageous technical effect of the sensitometric regulator ($b_4$) to be used according to the invention.

EXAMPLE 9 AND COMPARATIVE EXPERIMENTS V3 AND V4

Production and further processing of a novel recording element (Example 9) and conventional recording elements (Comparative Experiments V3 and V4); experimental method:

For Example 9, 50 parts by weight of a partially hydrolyzed polyvinyl acetate (degree of hydrolysis 82%, mean degree of polymerization about 500) and 20 parts by weight of a partially hydrolyzed vinyl acetate-/ethylene oxide graft copolymer having an ethylene oxide content of 22% by weight, a mean weight average molecular weight $\overline{M}_w$ of from $2.5 \times 10^4$ to $3 \times 10^4$ and a degree of hydrolysis of 82% were dissolved in 70 parts by weight of water at 90° C. After the resulting solutions had been cooled to 70° C., 10 parts by weight of butane-1,4-diol dimethacrylate, 53 parts by weight of 2-hydroxyethyl methacrylate, 1 part by weight of 2,4,6-trimethylbenzoyldiphenylphosphine oxide, 0.01 part by weight of hydroquinone, 0.01 part by weight of hydroquinone monomethyl ether ($b_{42}$), 0.014 part by weight of riboflavin ($b_{41}$) and 0.03 part by weight of the further mild reducing agent N-nitrosodiphenylamine ($b_{42}$) were stirred in.

In Comparative Experiment V3, the procedure described in Example 9 was followed, except that the addition of riboflavin ($b_{41}$) was dispensed with.

In Comparative Experiment V4, the procedure described in Example 9 was followed, except that the addition of trimethylbenzoyldiphenylphosphine oxide ($b_2$) was omitted.

After being degassed under reduced pressure, the three solutions were applied to steel sheets which had been covered with a layer containing an antihalation agent and with a conventional and known mixture of adhesive-forming components. Drying in the air for 24 hours at room temperature gave three photosensitive recording elements, each having a 0.5 mm thick, nontacky photopolymerizable recording layer.

These three photosensitive recording elements were pre-exposed uniformly for 2.5 seconds to an iron-doped mercury lamp and then exposed imagewise for 30 seconds to the standard photographic negative. During this procedure, no photopolymerization occurred in the recording layer of Comparative Experiment V4, even when the exposure time was increased to more than 10 minutes. Hence, only the imagewise exposed recording elements of Example 9 and of Comparative Experiment V3 were developed in a commerical spray washer at 40° C. and under a water pressure of 4 bar for 2.5 minutes and then dried.

On the relief layers of the relief printing plates obtained in this manner, the shadow well depths of the negative point $t_{NP}$ and the shadow well depths of the screen having a screen width of 24 lines/cm and a tonal value of 30% [$t_z(30)$], 50% [$t_z(50)$] and 70% [$t_z(70)$] were measured. At the same time, the quality of the relief structure was assessed visually. The relief printing plates were then clamped on printing cylinders and used for continuous letterpress printing.

The results of these experiments are summarized in Table 3.

The results of Table 3 show that the novel recording element of Example 9 was superior in every respect to the conventional recording element of Comparative Experiment V3.

TABLE 3

| | | Shadow well depths (Screen with 24 lines/cm) | | | | Relief quality | | Print characteristics: |
|---|---|---|---|---|---|---|---|---|
| | Exposure time (s) | $t_z(30)$ (μm) | $t_z(50)$ (μm) | $t_z(70)$ (μm) | $t_{NP}$ (μm) | Relief sidewalls | Relief edges | Print run of excellent copies |
| Example 9 | 30 | 125 | 90 | 73 | 165 | Steep | Smooth | Long - even without interruption of the printing process |
| Comparative Experiment V8 | 30 | 68 | 39 | 28 | 65 | Gentle slope | With fragmentation | Only in the usual range when the printing process is interrupted and the printing plate surface cleaned |

We claim:
1. A photosensitive recording element for the production of relief printing plates and photoresists, comprising
   A) a dimensionally stable substrate and
   B) at least one photopolymerizable recording layer consisting essentially of
      $b_1$) at least one partially or virtually completely hydrolyzed poly(vinyl alkanecarboxylate) and-

/or at least one partially or virtually completely hydrolyzed vinyl alkanecarboxylate/alkylene oxide graft copolymer as a binder, b₂) at least one photopolymerization initiator which, on exposure to short-wavelength actinic light, provides free radicals which initiate the photopolymerization, b₃) at least one photopolymerizable olefinically unsaturated compound (monomer) which is compatible with the binder ($b_1$), and/or photopolymerizable olefinically unsaturated radicals which are bonded as side radicals and/or terminal radicals to the binder ($b_1$), and b₄) at least two assistants, at least one of the said assistants ($b_4$) being selected from the group consisting of b₄₁) the isoalloxazines and the alloxazines, and at least one of the other assistants ($b_4$) being selected from the group consisting of b₄₂) the potassium salt of N-nitrosocyclohexylhydroxylamine, N-nitrosodiphenylamine and hydroquinone monomethyl ether, the amount used of the said assistants ($b_{41}$) and ($b_{42}$) being from 0.1 to 6% by weight, based on the total weight of the photopolymerizable recording layer (B), and the weight ratio ($b_{41}$):($b_{42}$) being from 1:2 to 1:1,000.

2. A photosensitive recording element as claimed in claim 1, wherein the assistants ($b_{41}$) are selected from the group consisting of alloxazine, isoalloxazines and alloxazines which are mono-, di-, tri-, tetra-, penta- or hexasubstituted by alkyl radicals, the alkyl radical or radicals being bonded to the alloxazine or isoalloxazine skeleton in the 3-, 5-, 6-, 7-, 8- and/or 9-positions, 6,7-dimethyl-9-(D'-ribityl)-flavin (riboflavin, RF), riboflavin tetrabutyrate (RTFB), riboflavin 5'-phosphate (flavin mononucleotide, FMN), and sodium salt of FMN.

3. A photosensitive recording element as claimed in claim 2, wherein the weight ratio ($b_{41}$):($b_{42}$) is from 1:10 to 1:100.

4. A photosensitive recording element as claimed in claim 1, wherein the weight ratio ($b_{41}$):($b_{42}$) is from 1:10 to 1:100.

* * * * *

UNITED STATES PATENT AND TRADEMARK OFFICE
CERTIFICATE OF CORRECTION

PATENT NO. : 5,112,723

DATED : May 12, 1992

INVENTOR(S) : HUEMMER et al.

It is certified that error appears in the above-identified patent and that said Letters Patent is hereby corrected as shown below:

Abstract in second to last line, "$B_{42}$" should read --$(b_{42})$--.

Signed and Sealed this

Thirteenth Day of July, 1993

Attest:

MICHAEL K. KIRK

Attesting Officer     Acting Commissioner of Patents and Trademarks